(12) United States Patent
Reuters et al.

(10) Patent No.: US 11,949,052 B2
(45) Date of Patent: Apr. 2, 2024

(54) OPTOELECTRONIC SEMICONDUCTOR COMPONENT AND METHOD OF PRODUCING AN OPTOELECTRONIC SEMICONDUCTOR COMPONENT

(71) Applicant: OSRAM OLED GmbH, Regensburg (DE)

(72) Inventors: Benjamin Reuters, Regensburg (DE); Johannes Saric, Regensburg (DE); Jens Müller, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 138 days.

(21) Appl. No.: 16/969,855

(22) PCT Filed: Feb. 7, 2019

(86) PCT No.: PCT/EP2019/052986
§ 371 (c)(1),
(2) Date: Aug. 13, 2020

(87) PCT Pub. No.: WO2019/158425
PCT Pub. Date: Aug. 22, 2019

(65) Prior Publication Data
US 2020/0381604 A1    Dec. 3, 2020

(30) Foreign Application Priority Data
Feb. 14, 2018   (DE) .......................... 102018103291.9

(51) Int. Cl.
*H01L 33/62* (2010.01)
*H01L 33/00* (2010.01)
(Continued)

(52) U.S. Cl.
CPC ............. *H01L 33/62* (2013.01); *H01L 33/005* (2013.01); *H01L 33/30* (2013.01); *H01L 33/405* (2013.01);
(Continued)

(58) Field of Classification Search
CPC ........... H01L 2933/0066; H01L 33/005; H01L 33/0093; H01L 33/22; H01L 33/30;
(Continued)

(56) References Cited

U.S. PATENT DOCUMENTS

| 6,429,460 B1 | 8/2002 | Chen et al. | |
| 2007/0114552 A1* | 5/2007 | Jang | H01L 33/46 |
| | | | 257/E33.056 |

(Continued)

FOREIGN PATENT DOCUMENTS

| DE | 102009054555 A1 | 6/2011 |
| DE | 102015118041 A1 | 4/2017 |

(Continued)

*Primary Examiner* — Matthew C Landau
*Assistant Examiner* — Dmitriy Yemelyanov
(74) *Attorney, Agent, or Firm* — MH2 TECHNOLOGY LAW GROUP LLP (57) ABSTRACT

In an embodiment, the optoelectronic semiconductor component (1) comprises a semiconductor layer sequence (2) with an active zone (22) for generating a radiation. On an bottom side (20) of the semiconductor layer sequence (2) there is an electrically insulating separation layer (3) with several openings (32). An adhesion-promoting layer (4) is located next to the openings (32) on a side of the separation layer (3) facing away from the semiconductor layer sequence (2). A continuous metallization layer (5) is located on a side of the adhesion-promoting layer (4) facing away from the semiconductor layer sequence (2). The semiconductor layer sequence (2) is electrically contacted in the openings (32) directly by the metallization layer (5). The metallization layer (5) and the openings (32) are spaced (Continued)

from the active zone (22) in the direction perpendicular to the separation layer (3).

14 Claims, 4 Drawing Sheets

(51) Int. Cl.
H01L 33/30 (2010.01)
H01L 33/40 (2010.01)
H01L 33/48 (2010.01)

(52) U.S. Cl.
CPC .... H01L 33/486 (2013.01); *H01L 2933/0066* (2013.01)

(58) Field of Classification Search
CPC ... H01L 33/382; H01L 33/405; H01L 33/486; H01L 33/62
See application file for complete search history.

(56) References Cited

U.S. PATENT DOCUMENTS

| | | | | |
|---|---|---|---|---|
| 2010/0123148 A1* | 5/2010 | Park | ........................ | H01L 33/20 |
| | | | | 257/94 |
| 2011/0089452 A1* | 4/2011 | Jeong | ...................... | H01L 33/44 |
| | | | | 257/E33.074 |
| 2011/0220940 A1* | 9/2011 | Kim | ...................... | H01L 33/405 |
| | | | | 257/E33.068 |
| 2011/0260186 A1* | 10/2011 | Jeong | ...................... | H01L 33/44 |
| | | | | 257/E33.059 |

FOREIGN PATENT DOCUMENTS

| | | |
|---|---|---|
| EP | 2187456 A2 | 5/2010 |
| EP | 2312655 A1 | 4/2011 |
| EP | 2381491 A1 | 10/2011 |

* cited by examiner

OPTOELECTRONIC SEMICONDUCTOR COMPONENT AND METHOD OF PRODUCING AN OPTOELECTRONIC SEMICONDUCTOR COMPONENT

CROSS-REFERENCE TO RELATED APPLICATIONS

This patent application is a national stage entry from International Application No. PCT/EP2019/052986, filed on Feb. 7, 2019, published as International Publication No. WO 2019/158425 A1 on Aug. 22, 2019, and claims priority under 35 U.S.C. § 119 from German patent application 10 2018 103 291.9, filed Feb. 14, 2018, the entire contents of all of which are incorporated herein by reference.

An optoelectronic semiconductor component is specified. In addition, a method of producing an optoelectronic semiconductor component is specified.

One object to be solved is to specify an optoelectronic semiconductor component which can be efficiently electrically contacted.

This object is solved, inter alia, by an optoelectronic semiconductor component with the features of claim 1. Preferred further developments are the subject of the other claims.

According to at least one embodiment, the semiconductor component comprises a semiconductor layer sequence. The semiconductor layer sequence has an active zone for generating a radiation. For this purpose the active zone preferably contains a single quantum well structure, a multiple quantum well structure and/or at least one pn junction.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ hold, respectively. Preferably for at least one layer or for all layers of the semiconductor layer sequence $0 < n \leq 0.8$, $0.4 \leq m < 1$ and $n+m \leq 0.95$ as well as $0 < k \leq 0.5$ hold. The semiconductor layer sequence may contain dopants as well as additional constituents. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

In particular, the optoelectronic semiconductor component is a light emitting diode chip, or LED chip for short. For example, the semiconductor component is configured to generate red light or near-infrared radiation. For example, a wavelength of maximum intensity of the radiation generated during operation is at least 570 nm or 605 nm and/or at most 1100 nm or 860 nm.

According to at least one embodiment, the semiconductor component comprises an electrically insulating separation layer. The separation layer is located on a bottom side of the semiconductor layer sequence. For example, the bottom side is located on a p-type region of the semiconductor layer sequence.

According to at least one embodiment, the separation layer has several openings. In the openings the semiconductor layer sequence is exposed. The openings are preferably limited to the separation layer, so that the openings do not or not significantly reach into the semiconductor layer sequence. In particular, the openings do not reach the active zone, so that the active zone remains unaffected by the openings.

According to at least one embodiment, the semiconductor component comprises an adhesion-promoting layer. The adhesion-promoting layer is located next to the openings, in particular exclusively next to the openings. This means that the openings are preferably free of the adhesion-promoting layer. The adhesion-promoting layer is also located on a side of the separation layer facing away from the semiconductor layer sequence, preferably directly on the separation layer. It is possible that the adhesion-promoting layer defines a cross-section of the openings. The adhesion-promoting layer may be directly adjacent to the openings.

According to at least one embodiment, the semiconductor component includes a metallization layer. The metallization layer may be a single layer of a single material. It is also possible that the metallization layer is composed of several sub-layers which, seen in plan view, may also have different degrees of coverage or coverage areas with regard to the semiconductor layer sequence or which are congruent. The partial layers can be made of the same or different materials. The metallization layer is located on a side of the adhesion-promoting layer facing away from the semiconductor layer sequence, preferably directly on the adhesion-promoting layer.

According to at least one embodiment, the metallization layer is a continuous layer. This means that the metallization layer is preferably uninterrupted and without gaps. Thus, the metallization layer is free of openings or holes.

According to at least one embodiment, the semiconductor layer sequence is located in the openings directly on the metallization layer. Thus the semiconductor layer sequence is electrically contacted via the metallization layer. In particular, the metallization layer is the only electrical contact on or to the bottom side of the semiconductor layer sequence.

According to at least one embodiment, the metallization layer and the openings are spaced from the active zone in a direction perpendicular to the separation layer. This means that, in particular in the direction parallel to a growth direction of the semiconductor layer sequence and/or perpendicular to the main directions of extension of the semiconductor layer sequence, neither the metallization layer nor the openings extend as far as the active zone. In other words, neither the metallization layer nor the openings penetrate the active zone as seen in cross-section.

In at least one embodiment, the optoelectronic semiconductor component comprises a semiconductor layer sequence with an active zone for generating radiation. An electrically insulating separation layer with several openings is located on a bottom side of the semiconductor layer sequence. A adhesion-promoting layer is located next to the openings on a side of the separation layer facing away from the semiconductor layer sequence. A continuous metallization layer is located on a side of the adhesion-promoting layer facing away from the semiconductor layer sequence. The semiconductor layer sequence is electrically contacted in the openings directly by the metallization layer. The metallization layer and the openings are spaced from the active zone in a direction perpendicular to the separation layer.

With the semiconductor component described here, it is possible to use metallic contacts that only occupy a comparatively small area on the bottom side of the semiconductor layer sequence and thus contribute only slightly to light absorption and optical losses. An efficient ohmic electrical contact can be achieved via the metallization layer, so that the semiconductor layer sequence can be contacted efficiently electrically. It is also possible to form the openings in the separation layer flat and smooth. This enables a morphology of the contact regions which allows continuous metal layers like the metallization layer. Furthermore, a high long-term stability can be achieved in difficult environmental conditions, for example in the presence of high humidity, corrosive gases and/or electrical fields.

This is achieved in particular by applying the dielectric separation layer and the adhesion-promoting layer to the semiconductor layer sequence and preferably by photolithographic structuring, in particular by means of dry etching and/or wet etching. This creates many point-like openings with radii in the range of nanometers to micrometers. The metallization layer is created before or after a mask is removed. The metallization layer serves as contact layer and as mirror layer. By curing at elevated temperatures, also known as annealing, an ohmic electrical characteristic can be improved. After annealing, the mirror layer in particular is applied and optionally barrier layers and/or coupling layers, for example with one or more solders, are applied. Such a coupling layer can also be used to absorb mechanical stresses, also known as strain, so that a yield can be improved in the production of semiconductor components.

According to at least one embodiment, the semiconductor component comprises a metallic coupling layer. The coupling layer is preferably a continuous layer. The coupling layer can be applied congruently to the metallization layer. The coupling layer is located on a side of the metallization layer facing away from the semiconductor layer sequence. The metallization layer can be located directly on the coupling layer.

According to at least one embodiment, the separation layer is transparent to the radiation generated during operation and/or is made of at least one material that is transparent to the radiation. For example, the separation layer is then made of an oxide such as silicon oxide or niobium oxide, a nitride such as silicon nitride or a fluoride such as magnesium fluoride.

According to at least one embodiment, the separation layer is reflective to the radiation generated during operation. This means that the separation layer is at least partially opaque to the radiation generated. In particular, the separation layer then comprises a Bragg mirror for the radiation generated during operation with a plurality of layers with alternating high and low refractive indices.

According to at least one embodiment, the adhesion-promoting layer is made of a transparent conductive oxide. Transparent conductive oxides, or TCOs for short, are transparent, electrically conductive materials, usually metal oxides, such as zinc oxide, tin oxide, cadmium oxide, titanium oxide, indium oxide or indium tin oxide (ITO). Besides binary metal oxygen compounds, such as ZnO, SnO2 or In2O3, ternary metal oxygen compounds, such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

In particular, the adhesion-promoting layer is made of ITO or of indium zinc oxide, IZO for short. Alternatively, the adhesion-promoting layer may be of a thin metal layer which is preferably partially transparent to the radiation generated, in particular with a thickness of at least 0.5 nm or 1 nm and/or at most 8 nm or 4 nm. In the case of a metal layer, the adhesion-promoting layer is preferably made of titanium.

According to at least one embodiment, the coupling layer extends into the openings. This means that in the direction parallel to a main extension direction of the semiconductor layer sequence and/or the active zone, both a material of the separation layer and the coupling layer are present in the area of the openings.

According to at least one embodiment, the coupling layer is located on a p-type side of the semiconductor layer sequence. The semiconductor layer sequence is preferably based on the material system AlInGaAs, AlInGaP or AlInGaAsP. A growth substrate for the semiconductor layer sequence is preferably no longer available in the finished semiconductor component. This means that a growth substrate has been removed from the semiconductor layer sequence.

According to at least one particularly preferred embodiment, a barrier layer is located on a side of the metallization layer facing away from the semiconductor layer sequence. Preferably, the barrier layer is a continuous layer that can be congruent with the metallization layer and/or the coupling layer. The barrier layer is preferably free of openings or holes. In particular, the barrier layer is located directly between the metallization layer and the coupling layer.

According to at least one embodiment, the barrier layer comprises one or more of the following materials or consists of one or more of these materials: Pt, Ti, TiW, TiWn, TiN.

According to at least one embodiment, the barrier layer, when the semiconductor component is used as intended, is configured to prevent diffusion of materials from the coupling layer into the metallization layer. The barrier layer can thus be described as a diffusion barrier layer for materials of the coupling layer. Thus it is possible to achieve that a high reflectivity of the metallization layer for the radiation generated during operation can be maintained even during long periods of operation.

According to at least one embodiment, the coupling layer is a solder for fixing the semiconductor component or comprises one or more such solders. For example, the coupling layer is made of AuInSn and/or NiInSn.

According to at least one embodiment, exclusively ohmically conductive and/or metallic materials are present in the region of the openings from a side of the coupling layer remote from the metallization layer to the bottom side of the semiconductor layer sequence. In particular, a current path from an electrical contact surface to the semiconductor layer sequence is free of materials from the class of transparent conductive oxides, or TCOs for short. The contact surface is preferably a side of the coupling layer facing away from the semiconductor layer sequence. By using only metallic materials for contacting the semiconductor layer sequence on the side of the separation layer, an electrical resistance in the contacting can be reduced.

According to at least one embodiment, the metallization layer, at least next to the openings, is a mirror for the radiation generated during operation. In addition to the openings, the metallization layer has, in particular directly on the adhesion-promoting layer, preferably a reflective metal such as silver or gold or aluminum or consists of gold or silver or aluminum, preferably of gold or a gold alloy.

According to at least one embodiment, the separation layer is configured for total reflection of the radiation generated during operation. In particular, there is a difference in the optical refractive index between the separation layer and the semiconductor layer sequence on the bottom side at a temperature of 300 K and at a wavelength of 650 nm of at least 1.0 or 1.3 or 1.6. This means that via the separation layer, radiation that hits the separation layer at comparatively flat angles is thrown back into the semiconductor layer sequence by means of total reflection. Radiation components that strike the separation layer approximately perpendicularly pass through the separation layer and are reflected at the metallization layer.

According to at least one embodiment, the metallization layer is composed of at least one contact layer and at least one mirror layer. All partial layers of the metallization layer are preferably metal layers.

According to at least one embodiment, the at least one contact layer is located directly on the bottom side and touches the semiconductor layer sequence. The contact layer is preferably limited to the openings. The contact layer and the separation layer preferably do not touch each other and are spaced from each other. This is especially true in the direction parallel to the main extension direction of the active zone. This means that the contact layer can be formed by a large number of individual points or islands separated from one another, which are located in the openings when viewed from above.

According to at least one embodiment, the mirror layer connects all partial areas of the contact layer continuously with each other. The mirror layer is preferably applied directly to the contact layer. It is possible that the mirror layer and the contact layer are made of different materials. Preferably, the mirror layer and the contact layer are made of the same material, for example gold or silver.

According to at least one embodiment, the openings are trapezoidal when viewed in cross-section. Alternatively or additionally, the openings taper towards the bottom, preferably steadily and strictly monotonously. Side surfaces of the openings can be straight or approximately straight when viewed in cross-section. This means that the openings can be frustoconical.

According to at least one embodiment, the metallization layer is located on a side facing away from the semiconductor layer sequence and on an edge of the openings in places closer to the bottom side than in a central area of the openings. This is particularly the case if the mirror layer reproduces the shape of the contact layer true to shape. At the edge of the contact layer, the mirror layer can be in direct contact with the semiconductor layer sequence, so that a step is formed in the mirror layer in a transition region of the mirror layer towards the contact layer.

In the central region of the openings, i.e. in particular above the associated contact layer, the side of the metallization layer remote from the semiconductor layer sequence, in particular the mirror layer, preferably runs flat. The area of the metallization layer which is closer to the bottom side at the edge than in the central area is preferably a closed curve, in particular a circle or an ellipse, when viewed from above.

According to at least one embodiment, the metallization layer consists of a single continuous mirror layer. In this case, the metallization layer is preferably made of gold or silver or a gold alloy or a silver alloy. In the openings, the metallization layer and thus the mirror layer is preferably located over the entire surface directly on the bottom side and preferably also on the separation layer, especially on the side surfaces of the separation layer. In addition to the openings, the mirror layer is preferably located over the entire surface and directly on the main separation layer. In this case, an electrical contact of the semiconductor layer sequence is made via the mirror layer.

According to at least one embodiment, the metallization layer reproduces the openings true to shape. In particular, this means that the metallization layer in the area of the openings is trapezoidal in shape when viewed in cross-section. The metallization layer can thus be flat on the bottom side and on a side of the adhesion-promoting layer facing away from the semiconductor layer sequence. At an edge of the openings, the metallization layer is preferably formed like part of a conical shell. In other words, the metallization layer on the adhesion-promoting layer is flat and preferably frustoconically shaped in the openings.

According to at least one embodiment, the metallization layer is thinner than the separation layer. In particular, the thickness of the separation layer exceeds the thickness of the metallization layer by at least a factor of 1.2 or 1.5 and/or by at most a factor of 4 or 2.

According to at least one embodiment, the metallization layer is thicker than the adhesion-promoting layer. Preferably, the thickness of the metallization layer exceeds the thickness of the adhesion-promoting layer by at least a factor of 10 or 20 or 30 and/or by at most a factor of 300 or 100 or 40.

According to at least one embodiment, the metallization layer is thicker than the barrier layer. For example, the thickness of the metallization layer exceeds the thickness of the barrier layer by at least a factor of 1.3 or 1.7 or 2 and/or by at most a factor of 50 or 10 or 3.

According to at least one embodiment, the metallization layer has several pins on the bottom side. The pins preferably penetrate at least 40 nm or 70 nm and/or at most 0.4 μm or 0.3 μm into the semiconductor layer sequence. The pins are configured to reduce electrical contact resistance between the metallization layer and the semiconductor layer sequence. The pins are preferably distributed irregularly in the openings across the bottom side.

In addition, a method of producing an optoelectronic semiconductor component is specified. In particular, the method is used to produce a semiconductor component as indicated in connection with one or more of the above mentioned embodiments. Features of the method are therefore also disclosed for the semiconductor component and vice versa.

In at least one embodiment the method comprises the following steps:
A) producing the semiconductor layer sequence,
B) producing the separation layer and the adhesion-promoting layer,
C) applying a mask layer and dry chemically etching the adhesion-promoting layer as well as wet chemically etching the separation layer, so that the openings are formed,
D) removing the mask layer, and
E) applying the metallization layer over the entire surface.

During the above steps, in particular the generation of the separation layer, the adhesion-promoting layer, the metallization layer and optionally the barrier layer and the coupling layer, exactly one mask layer is preferably used. This means that with only one mask layer, a structuring of the openings and the associated layers is enabled.

According to at least one embodiment, the method steps are carried out in the given order, i.e. A), B), C), D) and E).

According to at least one embodiment, step E) has the following sub-steps:
E1) creating the contact layer, and subsequently
E2) creating the mirror layer.

According to at least one embodiment, the process steps are carried out in the following order: A), B), C), E1), D), E2).

In the following, an optoelectronic semiconductor component described here and a method described here are explained in more detail with reference to the drawing using exemplary embodiments. Identical reference signs indicate identical elements in the individual figures. However, no scale references are shown, rather individual elements may be shown in exaggerated size for better understanding.

Figure 1:
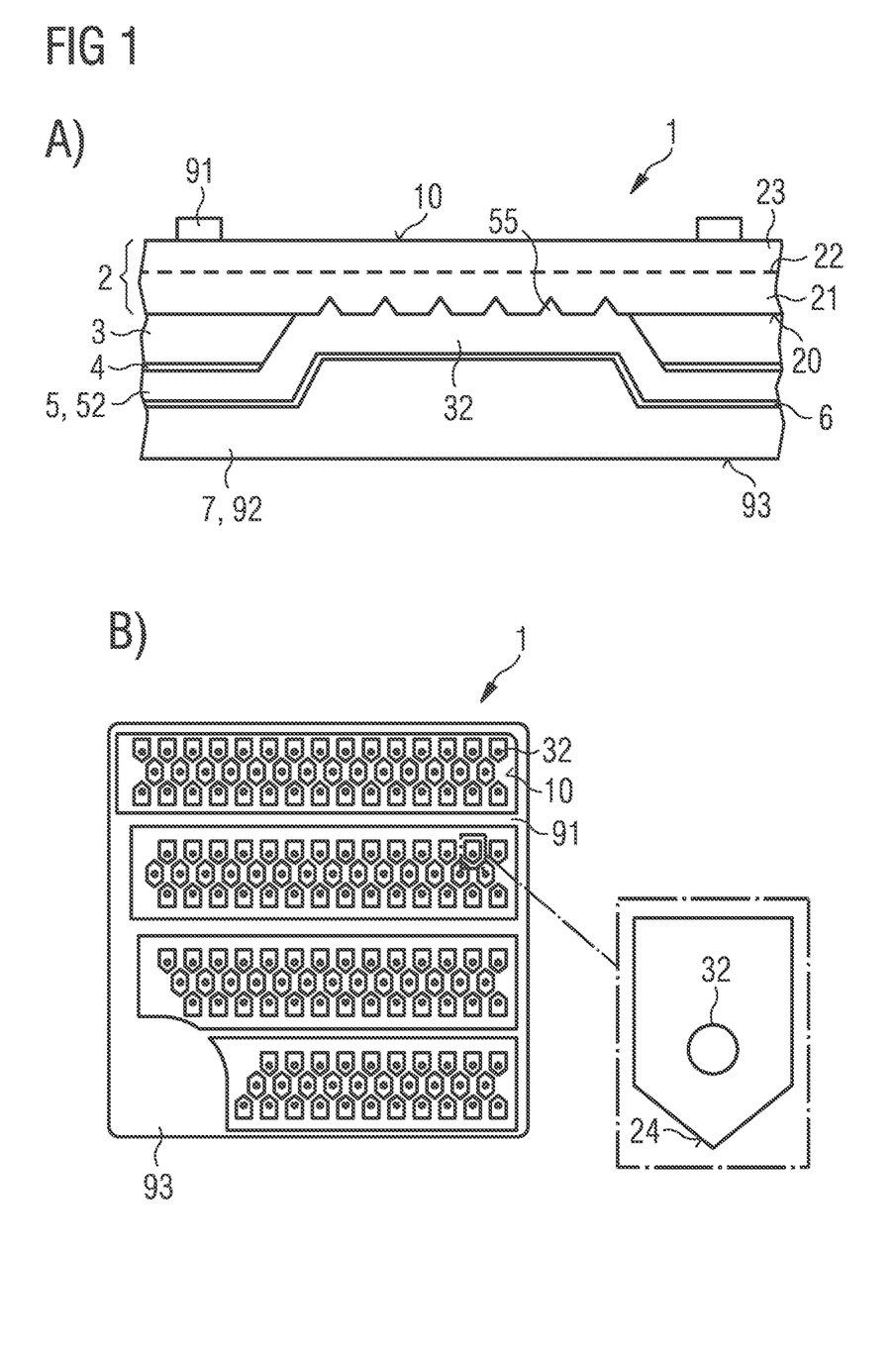
FIG. 1A shows a schematic sectional view of an exemplary embodiment of an optoelectronic semiconductor component described here.
FIG. 1B shows a schematic top view of an exemplary embodiment of an optoelectronic semiconductor component described here.

FIG. 1 illustrates an exemplary embodiment of an optoelectronic semiconductor component 1, see the sectional view in FIG. 1A and the top view in FIG. 1B. The semiconductor device 1 comprises a semiconductor layer sequence 2, which has a p-type region 21, an n-type region 23 and an intermediate active zone 22. During operation of semiconductor component 1, electromagnetic radiation is generated in the active zone 22, for example red light or near-infrared radiation. The semiconductor layer sequence 2 is based in particular on AlInGaP or AlInGaAs. It is possible that a light emission side 10 of the semiconductor component 1 is formed by the semiconductor layer sequence 2.

Furthermore, the semiconductor component 1 comprises an separation layer 3 on an bottom side 20 of the semiconductor layer sequence 2. The separation layer 3 is made of silicon dioxide, for example. A thickness of the separation layer 3 is preferably at least 0.2 µm and/or at most 0.8 µm, especially around 0.5 µm. Separation layer 3 is made of a material that is transparent to radiation generated during operation in active zone 22. At the same time, there is a large difference in the refractive indices between the semiconductor layer sequence 2 and the separation layer 3, so that separation layer 3 acts totally reflecting.

On a side of separation layer 3 that faces away from the semiconductor layer sequence 2, there is an adhesion-promoting layer 4 directly on separation layer 3. The adhesion-promoting layer 4 is made of ITO, for example. A thickness of the adhesion-promoting layer 4 is preferably at least 1 nm or 5 nm or 10 nm and/or at most 50 nm or 25 nm or 20 nm, in particular approximately 15 nm.

Openings 32 have been created in the separation layer 3 as well as in the adhesion-promoting layer 4, whereby only a single opening 32 is drawn in order to simplify the illustration in FIG. 1A. In the opening 32, the bottom side 20 of the semiconductor layer sequence 2 is exposed. The opening 32 is approximately frustoconical in shape. On the bottom side 20, opening 32 preferably has a diameter of at least 10 nm or 30 nm or 100 nm. Alternatively or additionally this diameter is at most 10 µm or 5 µm or 3 µm.

For the electrical contacting of the p-conducting region 21, there is a continuous metallization layer 5 over the entire surface of the bonding layer 4 and the semiconductor layer sequence 2. The metallization layer 5 is made of gold, for example. A thickness of the metallization layer 5 is preferably at least 70 nm or 200 nm and/or at most 0.8 µm or 0.5 µm, in particular approximately 0.3 µm. The metallization layer 5 reproduces the shape of the opening 32 in the separation layer 3 true to shape.

To improve electrical contact with the semiconductor layer sequence 2, a preferably irregularly distributed number of pins 55 are formed on the bottom side 20 of the metallization layer 5 in the semiconductor layer sequence 2. The pins 55 extend, for example, to about 200 nm into the semiconductor layer sequence 2, but do not reach the active zone 22.

The metallization layer 5 is formed by a mirror layer 52, so that the metallization layer 5 has a high reflectivity throughout for the radiation generated during operation of the active zone 22.

On a side facing away from the semiconductor layer sequence 2, the metallization layer 5 is preferably covered over its entire surface by a barrier layer 6. The barrier layer 6 is preferably made of Ti and/or Pt and has, for example, a thickness of at least 20 nm or 40 nm or 60 nm and/or of at most 0.3 µm or 0.2 µm, in particular approximately 0.1 µm.

The barrier layer 6 is continuously covered by a metallic coupling layer 7. The coupling layer 7 is a solder layer via which the semiconductor component 1 can be attached. The coupling layer 7 extends into the opening 32. Thus the coupling layer 7 may represent a second electrode 92 of the semiconductor component 1 and may form a contact surface 93. A first electrode 91 is located on the light emission side 10. The first electrode 91 extends preferably in strips starting from a contact surface 93 on the light emission side 10. In this case, a conductor cross-section of conductor tracks of the first electrode 91 can decrease monotonically in the direction away from the associated contact surface 93.

It is possible that around the openings 32, seen in plan view, for example pentagonal side flanks 24 of the semiconductor layer sequence 2 are generated. Such side flanks 24, which may also be present in all other exemplary embodiments, can be used to increase the light extraction efficiency of radiation from semiconductor component 1. Alternatively or in addition to such side edges 24 on the bottom side 20, a roughening on the light exit side 10 can be present.

In particular, the first electrode 91 is not shown in the further exemplary embodiments to simplify the representation. Preferably, however, such a first electrode 91 is also present in all other exemplary embodiments, as are the side flanks 24.

Figure 2:
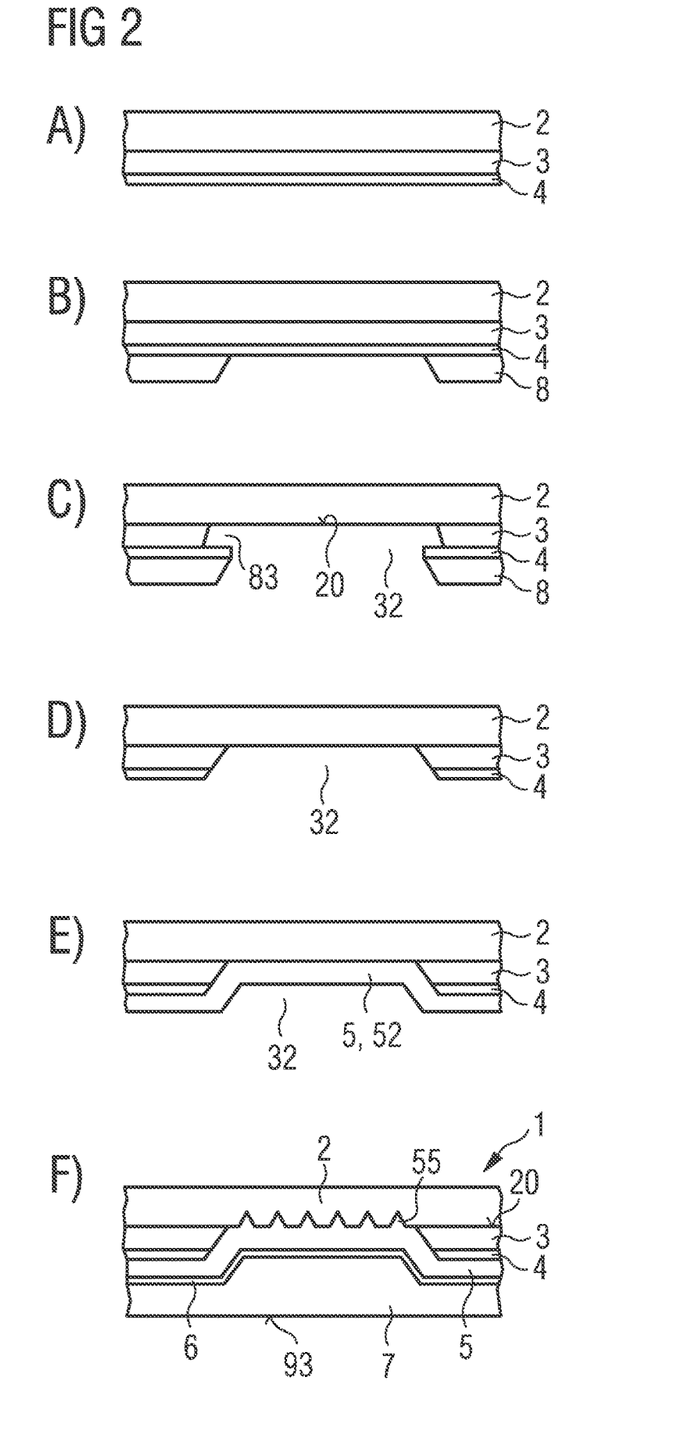
FIGS. 2A to 2F show schematic sectional views of method steps of a method described here for the production of optoelectronic semiconductor components described here.

FIG. 2 illustrates a method of producing the semiconductor component 1 of FIG. 1. As shown in FIG. 2A, the semiconductor layer sequence 2, the separation layer 3 and the adhesion-promoting layer 4 are produced continuously.

In the step shown in FIG. 2B, a mask layer 8 is applied and patterned so that the adhesion-promoting layer 4 is exposed in the area of the later openings.

This is followed preferably by dry chemical etching of the adhesion-promoting layer 4 and preferably wet chemical etching of the separation layer 3. The semiconductor layer sequence 2 preferably remains essentially unaffected by these etching steps, so that the bottom side 20 remains flat and continuous.

Wet chemical etching of the separation layer 3 can produce undercuts 83, which surround the openings 32 all around. The undercuts 83 are thus covered by the adhesion-promoting layer 4 and the mask layer 8.

As shown in FIG. 2D, mask layer 8 is removed. The same applies to previously protruding areas of the adhesion-promoting layer 4.

In the step shown in FIG. 2E, the metallization layer 5 is applied continuously as mirror layer 52. The metallization layer 5 reproduces the shape of the opening 32 true to shape.

In the step of FIG. 2F it is shown that the metallization layer 5 heals, also called annealing, resulting in the pins 55. Preferably, the continuous barrier layer 6 and the continuous coupling layer 7 are then created.

Figure 3:
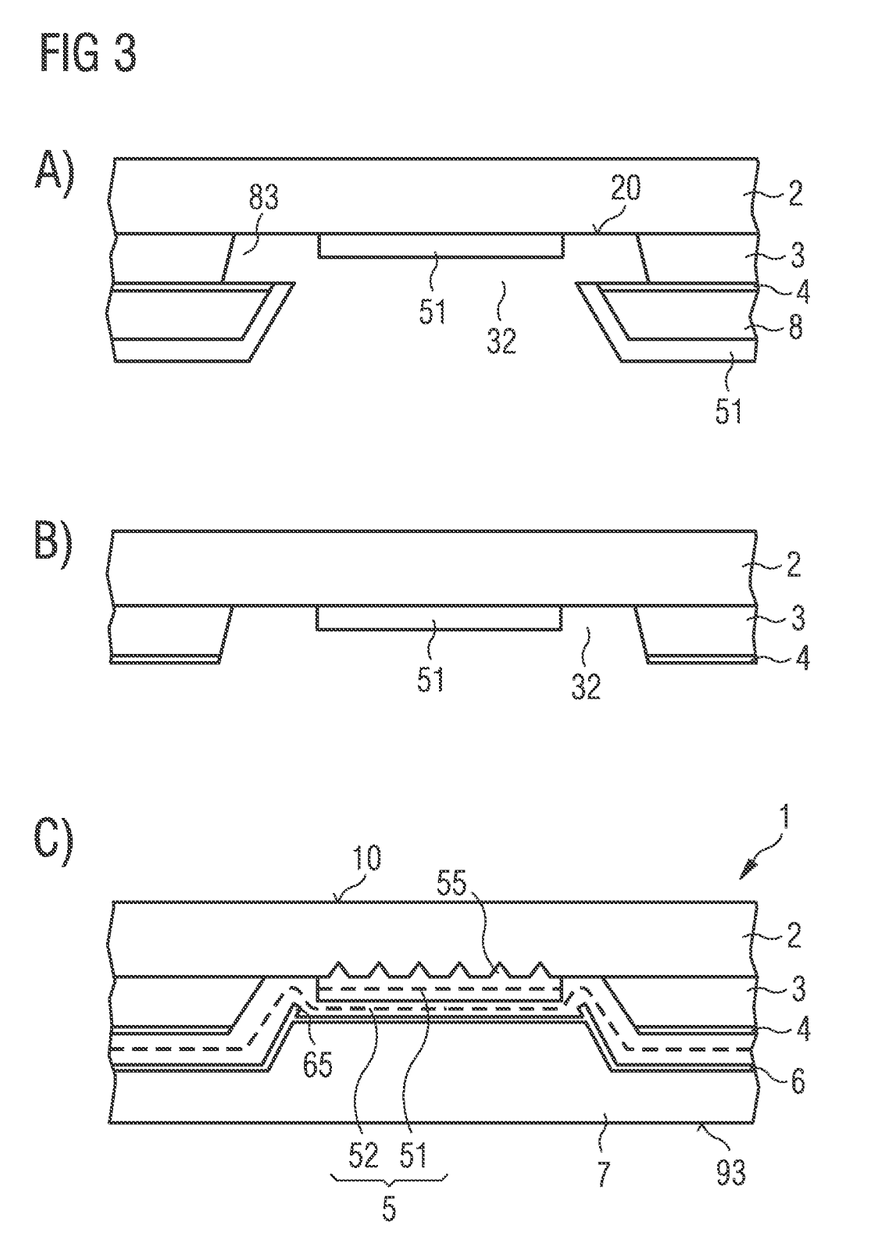
FIGS. 3A to 3C show schematic sectional views of method steps of a method described here for the production of optoelectronic semiconductor components described here.

FIG. 3 illustrates another example of a method of producing. The step in FIG. 3A is preferably preceded by the steps in FIGS. 2A to 2C inclusive.

According to FIG. 3A, a contact layer 51 is deposited for the metallization layer 5. The contact layer 51, for example, is made of gold. A thickness of contact layer 51 is preferably at least 20 nm or 50 nm or 100 nm and/or at most 0.5 µm or 0.3 µm. Due to the undercuts 83 and the directional deposition of a material for the contact layer 51, the contact layer 51 covers the bottom side 20 in the openings 32 only in a central area and not in an edge area. In the direction parallel to the bottom side 20, an extension of the undercuts 83, for example, is at least 0.1 µm or 0.5 µm and/or at most 5 µm or 1 µm.

FIG. 3B illustrates that the mask layer 8 is removed together with protruding areas of the adhesion-promoting layer 4 and excess material of contact layer 51. As a result, the contact layer 51 remains island-shaped in the central area of openings 32.

Then, see FIG. 3C, the mirror layer 52 is deposited over the entire surface, which together with contact layer 51 forms the metallization layer 5. FIG. 3C further indicates that both contact layer 51 and mirror layer 52 may be composed of several partial layers. Preferably, however, there is only one contact layer 51 and only one mirror layer 52. The pins 55 are created by a healing step.

On one edge of the contact layer 51 a bulge 65 is formed, which preferably surrounds the contact layer 51 in a ring shape. In the area of the bulge 65, a side of the metallization layer 5 remote from the semiconductor layer sequence 2 is closer to the semiconductor layer sequence 2 than in the central area at the contact layer 51.

As shown in FIG. 2F, the barrier layer 6 and the coupling layer 7 are then preferably created.

Removal of the mask layer 8 and/or application of the contact layer 51 may be preceded in FIG. 2 or 3 by cleaning steps such as the use of solvents, an oxygen plasma and/or ion purification.

Figure 4:
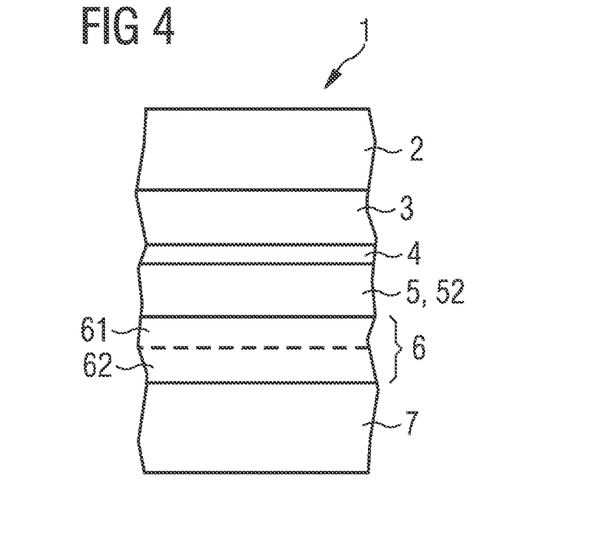
FIG. 4 shows a schematic sectional view of an exemplary embodiment of an optoelectronic semiconductor component described here.

FIG. 4 illustrates that the barrier layer 6 is composed of a first partial layer 61 and a second partial layer 62. For example, the first partial layer 61 is made of platinum and the second partial layer 62 is made of titanium. The partial layers 61, 62 can have the same thickness, for example about 50 nm each, or they can have different thicknesses. The same applies to all other exemplary embodiments.

Figure 5:
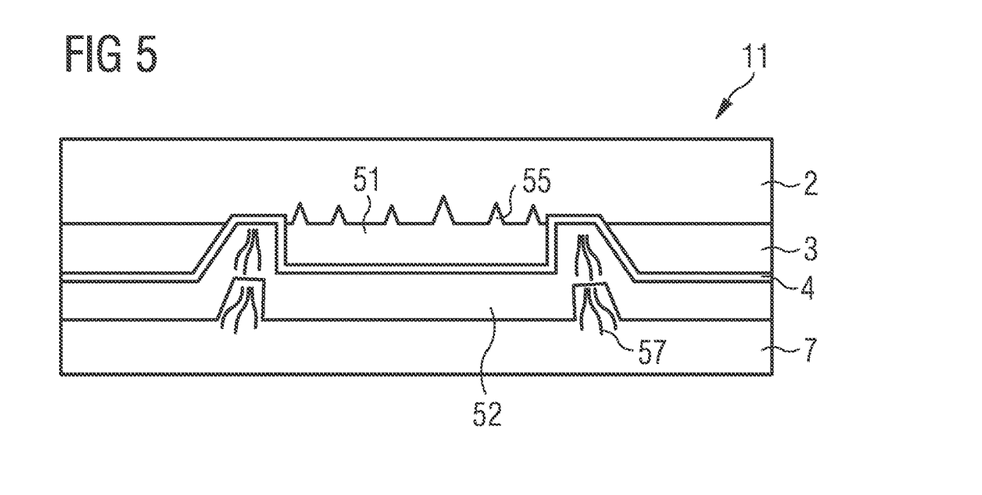
FIG. 5 shows a schematic sectional view of a modification of a semiconductor device.

FIG. 5 shows a modification 11 of a semiconductor component. Here, the adhesion-promoting layer 4 extends continuously over the separation layer 3 and the contact layer 51. The mirror layer 52 is applied in a continuous manner. A barrier layer is not present in modification 11 of FIG. 5.

The comparatively pronounced step at the edge of contact layer 51 may cause defects 57. These defects 57 may reduce the service life of modification 11. In addition, the adhesion-promoting layer 4 is located in a current path for supplying current to the semiconductor layer sequence 2.

In contrast, in the exemplary embodiment shown in FIG. 1, in particular, there is an exclusively metallic contact and the adhesion-promoting layer 4 is limited to an area between the separation layer 3 and the mirror layer 52. This means that there is no contact between the adhesion-promoting layer 4 and the semiconductor layer sequence 2. This allows a better mechanical cohesion of the layers in the opening 32 to be achieved. In addition, open contacts due to possible degradation are avoided, e.g. due to ageing of the adhesion-promoting layer.

The barrier layer 2 between the mirror layer 52 and the coupling layer 7 in the exemplary embodiments prevents or significantly slows down degradation due to diffusion or electromigration. This leads to a stabilization of the semiconductor component 1 in difficult environmental conditions, for example in high humidity, in the presence of corrosive gases and/or in the presence of electric fields.

Especially in the exemplary embodiment of FIG. 1, contrary to the modification of FIG. 5, a whole bottom surface of the opening 32 is used for the electrical contacting of the semiconductor layer sequence 2. This results in a low contact resistance and a contact surface is maximized. Furthermore, a mirror surface for reflection of the generated radiation is maximized.

In contrast to the steps at the edge of contact layer 51, as shown in FIG. 5, a flat overforming of edges of opening 32 is possible, especially in the exemplary embodiment of FIG. 1. This allows high-quality, continuous layers, especially for the metallization layer 5, to be achieved largely without defects or disturbances. In particular, this allows a high-quality barrier layer to be produced.

Figure 6:
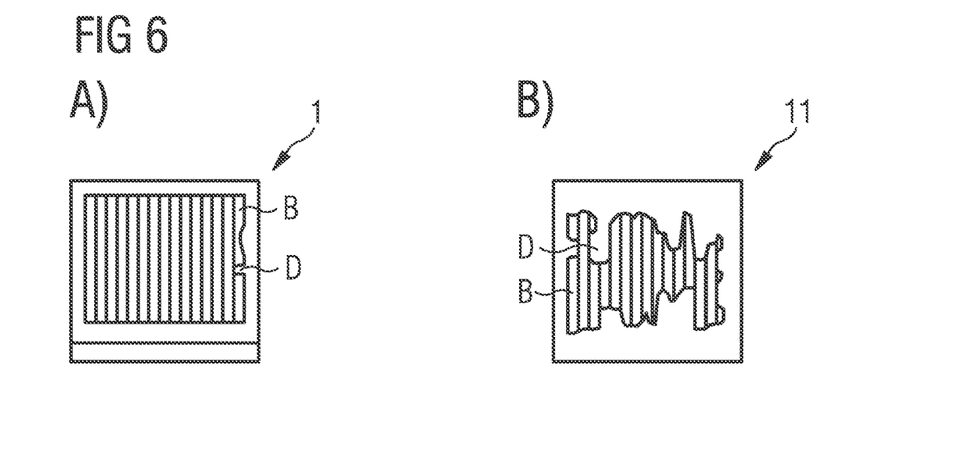
FIG. 6 shows schematic top views of the light pattern of a semiconductor component described here in figure part A and a modification of a semiconductor component in figure part B.

FIG. 6A illustrates that even after 1000 hours of operation, a regular pattern of light areas B and dark areas D of the semiconductor component 1, especially shaped as in FIG. 1, can be achieved. Only very small dark areas D can be detected, which are due to corrosion and defects. In contrast, in modification 11, especially configured as in FIG. 5, large dark areas D can be seen starting from the edges of the semiconductor layer sequence 2.

By the configuration of the metallization layer 5, the openings 32 and the presence of the barrier layer 6, an increased long-term stability of the semiconductor component 1 can be achieved.

Unless otherwise indicated, the elements shown in the figures preferably follow each other directly in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention described here is not limited by the description using the exemplary embodiments. Rather, the invention comprises each new feature as well as each combination of features, which in particular includes each combination of features in the claims, even if this feature or combination itself is not explicitly stated in the claims or exemplary embodiments.

LIST OF REFERENCE SIGNS 1 optoelectronic semiconductor component
10 light emission side
2 semiconductor layer sequence
20 bottom side of the semiconductor layer sequence
21 p-conducting region
22 active zone
23 n-conducting region
24 lateral flank
3 separation layer
32 opening
4 adhesion-promoting layer
5 metallization layer
51 contact layer
52 mirror layer
55 pin
57 defect
6 barrier layer
61 first partial layer
62 second partial layer
65 bulge
7 coupling layer
8 mask layer
83 undercut
91 first electrode
92 second electrode
93 contact surface
11 modification of a semiconductor component
B light areas
D dark areas

The invention claimed is:

1. An optoelectronic semiconductor component comprising:
a semiconductor layer sequence with an active zone for generating a radiation, and the semiconductor layer comprises a light emission side, a bottom side that is opposite the light emission side, and an electrode that is arranged on the light emission side;
an electrically insulating separation layer having a plurality of openings, and the electrically insulating separation layer is positioned against the bottom side of the semiconductor layer sequence;
an adhesion-promoting layer provided next to the plurality of openings, and positioned on a side of the electrically insulating separation layer that is facing away from the semiconductor layer sequence; and
a continuous metallization layer positioned on a side of the adhesion-promoting layer that is facing away from the semiconductor layer sequence;
wherein the semiconductor layer sequence is in direct electrical contact with the continuous metallization layer within the plurality of openings of the electrically insulating separation layer, such that the continuous metallization layer directly adjoins the bottom side of the semiconductor layer sequence inside the plurality of openings,
wherein the continuous metallization layer and the plurality of openings are spaced from the active zone in a direction perpendicular to the separation layer,
wherein the openings are frustoconical in shape and have a diameter of at most 10 μm at the bottom side,
wherein the plurality of openings are spaced apart from one another, such that the electrically insulating separation layer adjoins the bottom side of the semiconductor layer sequence at any position laterally beside the plurality of opening, and the electrically insulating separation layer and the adhesion-promoting layer are arranged in between directly adjacent openings, and
wherein the plurality of openings in the electrically insulating separation layer do not overlap with the electrode in the semiconductor layer sequence in a top view of the optoelectronic semiconductor component.

2. The optoelectronic semiconductor component according to claim 1,
further comprising a continuous metallic coupling layer on a side of the metallization layer remote from the semiconductor layer sequence,
wherein the separation layer is transparent to the radiation generated during operation and the adhesion-promoting layer is of a transparent conductive oxide.

3. The optoelectronic semiconductor component according to claim 2,
in which the coupling layer extends into the openings and completely covers the metallization layer,
wherein the coupling layer is located on a p-type side of the semiconductor layer sequence and the semiconductor layer sequence is of the material system AlInGaAs and/or AlInGaP.

4. The optoelectronic semiconductor component according to claim 1,
in which directly on a side of the metallization layer remote from the semiconductor layer sequence there is a continuous barrier layer which comprises one or more of the following materials: Pt, Ti, TiW, TiWN, TiN.

5. The optoelectronic semiconductor component according to claim 4,
in which the continuous barrier layer comprising one or more of Pt, Ti, TiW, TiWn, and TiN prevents diffusion of materials from the coupling layer into the metallization layer, and
further comprising a continuous metallic coupling layer on a side of the metallization layer remote from the semiconductor layer sequence,
wherein the coupling layer contains or is a solder for fixing the semiconductor component.

6. The optoelectronic semiconductor component according to claim 1,
further comprising a continuous metallic coupling layer on a side of the metallization layer remote from the semiconductor layer sequence,
in which metallic materials are present in the region of the openings from a side of the coupling layer remote from the metallization layer to the bottom side of the semiconductor layer sequence.

7. The optoelectronic semiconductor component according to claim 1,
in which the metallization layer, at least next to the openings, is a mirror for the radiation generated during operation,
wherein a difference between an optical refractive index of the separation layer and an optical refractive index of the semiconductor layer sequence on the bottom side is at least 1.0 at a temperature of 300 K and at a wavelength of 650 nm.

8. The optoelectronic semiconductor component according to claim 1, in which the metallization layer is composed of at least one contact layer directly on the bottom side and is of at least one mirror layer, wherein the contact layer is limited to the openings and is spaced from the separation layer.

9. The optoelectronic semiconductor component according to claim 8, in which the openings are trapezoidal in cross-section and taper towards the bottom side, wherein a side of the metallization layer remote from the semiconductor layer sequence lies at an edge of the openings in places closer to the bottom side than in a central region of the openings.

10. The optoelectronic semiconductor component according to claim 1, in which the metallization layer consists of a single continuous mirror layer, wherein the single continuous mirror layer is applied directly to the bottom side in the openings as well as to the separation layer and the single continuous mirror layer is located next to the openings over an entire surface directly on the adhesion-promoting layer.

11. The optoelectronic semiconductor component according to claim 10, in which the openings are trapezoidal in cross-section and taper towards the bottom side, wherein the metallization layer reproduces the openings true to shape.

12. The optoelectronic semiconductor component according to claim 1, in which the metallization layer is thinner than the separation layer, and in which directly on a side of the metallization layer remote from the semiconductor layer sequence there is a continuous barrier layer, wherein the metallization layer is at least a factor of 15 thicker than the adhesion-promoting layer, and wherein the metallization layer is thicker than the barrier layer.

13. The optoelectronic semiconductor component according to claim 1, in which the metallization layer has a plurality of pins on the bottom side which penetrate into the semiconductor layer sequence at least 40 nm and at most 0.4 µm, wherein the pins reduce an electrical contact resistance between the metallization layer and the semiconductor layer sequence.

14. The optoelectronic semiconductor component according to claim 1, in which the adhesion-promoting layer is located only next to and directly at the openings.

\* \* \* \* \*